(12) United States Patent
Tanaka et al.

(10) Patent No.: US 10,643,874 B2
(45) Date of Patent: May 5, 2020

(54) SUBSTRATE LIQUID PROCESSING APPARATUS, SUBSTRATE LIQUID PROCESSING METHOD, AND STORAGE MEDIUM

(71) Applicant: Tokyo Electron Limited, Tokyo (JP)

(72) Inventors: Hiroshi Tanaka, Kumamoto (JP); Tsukasa Hirayama, Kumamoto (JP); Takao Inada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/617,134

(22) Filed: Jun. 8, 2017

(65) Prior Publication Data

US 2017/0358470 A1 Dec. 14, 2017

(30) Foreign Application Priority Data

Jun. 9, 2016 (JP) .................................. 2016-115601

(51) Int. Cl.
*H01L 21/67* (2006.01)

(52) U.S. Cl.
CPC .. *H01L 21/67248* (2013.01); *H01L 21/67017* (2013.01); *H01L 21/67086* (2013.01); *H01L 21/67253* (2013.01)

(58) Field of Classification Search
CPC ......... H01L 21/67248; H01L 21/67017; H01L 21/67253; H01L 21/67086
See application file for complete search history.

(56) References Cited

U.S. PATENT DOCUMENTS

2012/0248061 A1* 10/2012 Brown .............. H01L 21/30612
216/12

FOREIGN PATENT DOCUMENTS

JP 2013-093478 A 5/2013

* cited by examiner

*Primary Examiner* — Nadine G Norton
*Assistant Examiner* — Mahmoud Dahimene
(74) *Attorney, Agent, or Firm* — Abelman, Frayne & Schwab

(57) ABSTRACT

A substrate liquid processing apparatus includes a liquid processing unit, a processing liquid circulating line, and a boiling state detecting unit provided in a processing bath of the liquid processing unit. The controller controls a supply pump of the processing liquid circulating line based on a signal from the boiling state detecting unit, and adjusts a pressure of a supplied phosphoric acid aqueous solution in a flow path so as to adjust the boiling state of the phosphoric acid aqueous solution to a desired state.

7 Claims, 4 Drawing Sheets

SUBSTRATE LIQUID PROCESSING APPARATUS, SUBSTRATE LIQUID PROCESSING METHOD, AND STORAGE MEDIUM

CROSS-REFERENCE TO RELATED APPLICATIONS

This application is based on and claims priority from Japanese Patent Application No. 2016-115601, filed on Jun. 9, 2016, with the Japan Patent Office, the disclosure of which is incorporated herein in its entirety by reference.

TECHNICAL FIELD

The present disclosure relates to a substrate liquid processing apparatus that performs a liquid processing on a substrate using a processing liquid, a substrate liquid processing method and a storage medium.

BACKGROUND

When, for example, a semiconductor component or a flat panel display is manufactured, a substrate liquid processing apparatus is used to perform a processing, such as etching, on a substrate such as a semiconductor wafer or a liquid crystal substrate using a processing liquid such as an etching liquid.

For example, a substrate liquid processing apparatus disclosed in Japanese Patent Laid-Open Publication No. 2013-093478 performs a process of immersing a substrate in a processing liquid (an etching liquid: a phosphoric acid aqueous solution) stored in a processing bath, and etching a silicon nitride film formed on the surface of the substrate.

In the substrate liquid processing apparatus, a phosphoric acid aqueous solution obtained by diluting phosphoric acid with pure water to a predetermined concentration is used as the processing liquid. In the substrate liquid processing apparatus, the phosphoric acid aqueous solution is heated to a predetermined concentration and a predetermined temperature, and boiled to be used for performing an etching processing.

However, with this alone, it is difficult to secure etching uniformity, and thus improvement is necessary in terms of the etching uniformity.

SUMMARY

An aspect of the present disclosure provides a substrate liquid processing apparatus including: a liquid processing unit configured to store a processing liquid and substrates and process the substrates using the processing liquid, the processing liquid including a phosphoric acid aqueous solution; a processing liquid supply unit including a supply pump configured to supply the processing liquid to the liquid processing unit; a boiling state detecting unit provided in the liquid processing unit and configured to detect a boiling state of the processing liquid; and a controller configured to control the supply pump based on a signal from the boiling state detecting unit and adjust a pressure of the processing liquid in a flow path supplied from the processing liquid supply unit to the liquid processing unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
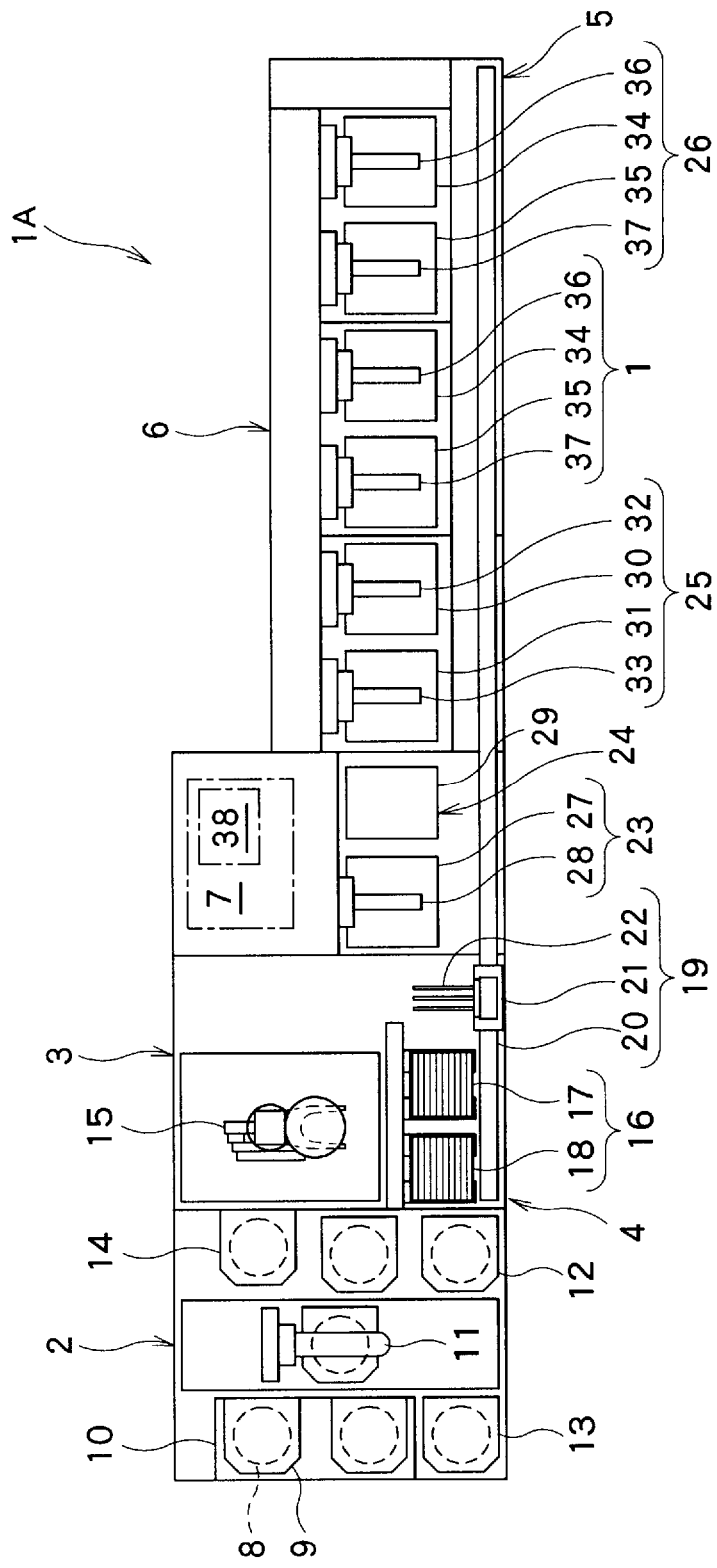
FIG. 1 is a plan view illustrating an entire substrate liquid processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made in view of these circumstances, and an object of the present disclosure is to provide a substrate liquid processing apparatus, a substrate liquid processing method, and a storage medium, which may achieve an improvement of the etching uniformity in the processing using the phosphoric acid aqueous solution.

According to an aspect of the present disclosure, there is provided a substrate liquid processing apparatus including: a liquid processing unit configured to store a processing liquid and substrates and process the substrates using the processing liquid, the processing liquid including a phosphoric acid aqueous solution; a processing liquid supply unit including a supply pump configured to supply the processing liquid to the liquid processing unit; a boiling state detecting unit provided in the liquid processing unit and configured to detect a boiling state of the processing liquid; and a controller configured to control the supply pump based on a signal from the boiling state detecting unit and adjust a pressure of the processing liquid in a flow path supplied from the processing liquid supply unit to the liquid processing unit.

In the above-described substrate liquid processing apparatus, when the boiling state of the processing liquid is intense based on the signal from the boiling state detecting unit, the controller increases the pressure of the processing liquid from the supply pump to suppress the boiling state of the processing liquid in the flow path, and when the boiling state of the processing liquid is gentle, the controller may decrease the pressure of the processing liquid from the supply pump to promote the boiling state of the processing liquid in the flow path.

In the above-described substrate liquid processing apparatus, the processing liquid supply unit may include a processing liquid circulating line connected to the liquid processing unit, and the supply pump is provided in the processing liquid circulating line.

In the above-described substrate liquid processing apparatus, the processing liquid supply unit may be connected to a phosphoric acid aqueous solution supply unit configured to supply the phosphoric acid aqueous solution, and a pure water supply unit configured to supply pure water.

According to an another aspect of the present disclosure, there is provided a method of performing a liquid processing on substrates, the method including: processing the substrates using a processing liquid including a phosphoric acid aqueous solution in a liquid processing unit that stores the processing liquid and the substrates; supplying the processing liquid to the liquid processing unit by a processing liquid supply unit including a supply pump; detecting a boiling state of the processing liquid by a boiling state detecting unit provided in the liquid processing unit; and controlling the supply pump based on a signal from the boiling state detecting unit by a controller and adjusting a pressure of the processing liquid in a flow path supplied from the processing liquid supply unit to the liquid processing unit.

In the above-described method, when the boiling state of the processing liquid is intense based on the signal from the boiling state detecting unit, the controller may increase the pressure of the processing liquid in the flow path from the supply pump to suppress the boiling state of the processing liquid, and when the boiling state of the processing liquid is gentle, the controller may decrease the pressure of the processing liquid in the flow path from the supply pump to promote the boiling state of the processing liquid.

In the above-described method, the processing liquid supply unit may include a processing liquid circulating line connected to the liquid processing unit, and the supply pump is provided in the processing liquid circulating line.

In the above-described method, the processing liquid supply unit may be connected to a phosphoric acid aqueous solution supply unit configured to supply the phosphoric acid aqueous solution, and a pure water supply unit configured to supply pure water.

According to yet another aspect of the present disclosure, there is provided a storage medium causing a computer to execute a method of performing a liquid processing on substrates, the method comprising: processing the substrates using a processing liquid including a phosphoric acid aqueous solution in a liquid processing unit that stores the processing liquid and the substrates; supplying the processing liquid to the liquid processing unit by a processing liquid supply unit including a supply pump; detecting a boiling state of the processing liquid by a boiling state detecting unit provided in the liquid processing unit; and controlling the supply pump based on a signal from the boiling state detecting unit by a controller and adjusting a pressure of the processing liquid in a flow path supplied from the processing liquid supply unit to the liquid processing unit.

According to the present disclosure, it is possible to achieve the etching uniformity by adjusting a boiling state of the phosphoric acid aqueous solution to a desired state without changing the concentration of the phosphoric acid aqueous solution.

Hereinafter, an exemplary embodiment of the present disclosure will be described with reference to FIG. 1 to FIGS. 4A and 4B. First, an entire substrate liquid processing system 1A in which a substrate liquid processing apparatus 1 according to the present disclosure is incorporated will be described.

As illustrated in FIG. 1, the substrate liquid processing system 1A includes a carrier carry-in/out section 2, a lot forming section 3, a lot placing section 4, a lot conveyance section 5, a lot processing section 6, and a controller 7.

Among these, the carrier carry-in/out section 2 performs carrying-in/out of carriers 9 in each of which a plurality of substrates (silicon wafers) 8 (e.g., 25 sheets) in a horizontal posture are accommodated while vertically aligned.

The carrier carry-in/out section 2 is provided with a carrier stage 10 on which the plurality of carriers 9 are placed, a carrier conveyance mechanism 11 configured to convey the carriers 9, carrier stocks 12 and 13 that tempo-
rarily store the carriers 9, and a carrier placing table 14 on which the carriers 9 are placed. Here, the carrier stock 12 temporarily stores the substrates 8 to become products before the substrates 8 are processed in the lot processing section 6. The carrier stock 13 temporarily stores the substrates 8 to become products after the substrates 8 are processed in the lot processing section 6.

Then, the carrier carry-in/out section 2 conveys the carrier 9 carried into the carrier stage 10 from the outside, to the carrier stock 12 or the carrier placing table 14 using the carrier conveyance mechanism 11. The carrier carry-in/out section 2 conveys the carrier 9 placed on the carrier placing table 14 to the carrier stock 13 or the carrier stage 10 using the carrier conveyance mechanism 11. The carrier 9 conveyed to the carrier stage 10 is carried to the outside.

The lot forming section 3 forms a lot including a plurality of substrates 8 (for example, 50 sheets) to be simultaneously processed by combining the substrates 8 accommodated in one or more carriers 9. When the lot is formed, pattern-formed surfaces of the substrates 8 may face each other, or all pattern-formed surfaces of the substrates 8 may be toward one side.

The lot forming section 3 is provided with a substrate conveyance mechanism 15 configured to convey the plurality of substrates 8. The substrate conveyance mechanism 15 may change the posture of the substrates 8 from a horizontal posture to a vertical posture, and from a vertical posture to a horizontal posture during the conveyance of the substrates 8.

Then, the lot forming section 3 conveys the substrates 8 from the carrier 9 placed on the carrier placing table 14 to the lot placing section 4 using the substrate conveyance mechanism 15, and places the substrates 8 forming the lot in the lot placing section 4. The lot forming section 3 conveys the lot placed in the lot placing section 4 to the carrier 9 placed on the carrier placing table 14 by the substrate conveyance mechanism 15. The substrate conveyance mechanism 15 includes, as a substrate support unit configured to support the plurality of substrates 8, two types of substrate supports, that is, an unprocessed substrate support that supports unprocessed substrates 8 (before the substrates 8 are conveyed by the lot conveyance section 5), and a processed substrate support that supports processed substrates 8 (after the substrates 8 are conveyed by the lot conveyance section 5). Accordingly, for example, particles adhering to the unprocessed substrates 8 may be suppressed from sticking to, for example, the processed substrates 8.

In the lot placing section 4, the lots conveyed between the lot forming section 3 and the lot processing section 6 by the lot conveyance section 5 are temporarily placed (on standby) on a lot placing table 16.

The lot placing section 4 is provided with a carry-in side lot placing table 17 on which an unprocessed lot is placed (before the lot is conveyed by the lot conveyance section 5), and a carry-out side lot placing table 18 on which a processed lot is placed (after the lot is conveyed by the lot conveyance section 5). In each of the carry-in side lot placing table 17 and the carry-out side lot placing table 18, the plurality of substrates 8 for one lot are placed in a vertical posture to be aligned in the front-rear direction.

In the lot placing section 4, the lot formed by the lot forming section 3 is placed on the carry-in side lot placing table 17, and is carried into the lot processing section 6 through the lot conveyance section 5. In the lot placing section 4, the lot carried out of the lot processing section 6 through the lot conveyance section 5 is placed on the carry-out side lot placing table 18, and is conveyed to the lot forming section 3.

The lot conveyance section 5 conveys lots between the lot placing section 4 and the lot processing section 6 or the inside of the lot processing section 6.

The lot conveyance section 5 is provided with a lot conveyance mechanism 19 configured to convey lots. The lot conveyance mechanism 19 is constituted by a rail 20 arranged along the lot placing section 4 and the lot processing section 6, and a moving body 21 which holds the plurality of substrates 8 and moves along the rail 20. A substrate holder 22 configured to hold the plurality of substrates 8 aligned in a vertical posture in a front-rear direction is provided in the moving body 21 so as to freely advance and retreat.

The lot conveyance section 5 receives the lot placed on the carry-in side lot placing table 17 by the substrate holder 22 of the lot conveyance mechanism 19, and delivers the received lot to the lot processing section 6. The lot conveyance section 5 receives the lot processed in the lot processing section 6 by the substrate holder 22 of the lot conveyance mechanism 19, and delivers the lot to the carry-out side lot placing table 18. The lot conveyance section 5 conveys the lot within the lot processing section 6 using the lot conveyance mechanism 19.

The lot processing section 6 performs processings such as, for example, etching, cleaning, or drying, on one lot constituted by the plurality of substrates 8 aligned in the vertical posture in the front-rear direction.

In the lot processing section 6, a drying device 23 configured to dry the substrates 8, a substrate holder cleaning device 24 configured to clean the substrate holder 22, a cleaning device 25 configured to clean the substrates 8, and two etching devices (substrate liquid processing apparatuses) 1 according to the present disclosure, which are configured to etch the substrates 8, are provided to be aligned.

The drying device 23 includes a processing bath 27, and a substrate lift mechanism 28 provided in the processing bath 27 so as to be able to move up and down. A drying processing gas (e.g., isopropyl alcohol (IPA)) is supplied to the processing bath 27. In the substrate lift mechanism 28, the plurality of substrates 8 for one lot are held to be aligned in the vertical posture in the front-rear direction. The drying device 23 receives the lot from the substrate holder 22 of the lot conveyance mechanism 19 by the substrate lift mechanism 28, and moves up and down the lot by the substrate lift mechanism 28 so that the substrates 8 are dried by the drying processing gas supplied to the processing bath 27. The drying device 23 delivers the lot from the substrate lift mechanism 28 to the substrate holder 22 of the lot conveyance mechanism 19.

The substrate holder cleaning device 24 includes a processing bath 29, and is configured to supply a cleaning processing liquid and a drying gas to the processing bath 29. The substrate holder cleaning device 24 supplies the cleaning processing liquid to the substrate holder 22 of the lot conveyance mechanism 19, and supplies the drying gas to the substrate holder 22 so as to clean the substrate holder 22.

The cleaning device 25 includes a cleaning processing bath 30 and a rinse processing bath 31, and substrate lift mechanisms 32 and 33 are provided in the processing baths 30 and 31, respectively, so as to be able to move up and down. A cleaning processing liquid (e.g., SC-1) is stored in the cleaning processing bath 30. A rinse processing liquid (e.g., pure water) is stored in the rinse processing bath 31.

The etching device 1 includes a processing bath 34 for etching and a processing bath 35 for rinsing, and substrate lift mechanisms 36 and 37 are provided in the processing baths 34 and 35, respectively, so as to be able to move up and down. An etching processing liquid (phosphoric acid aqueous solution) is stored in the processing bath 34 for etching. A rinse processing liquid (e.g., pure water) is stored in the processing bath 35 for rinsing. As described above, the etching device 1 constitutes the substrate liquid processing apparatus according to the present disclosure.

The cleaning device 25 and the etching device 1 have the same configuration. Among these, the etching device (the substrate liquid processing apparatus) 1 will be described. In the substrate lift mechanism 36, the plurality of substrates 8 for one lot are held to be aligned in the vertical posture in the front-rear direction. In the etching device 1, the lot is received from the substrate holder 22 of the lot conveyance mechanism 19 by the substrate lift mechanism 36, and is moved up and down by the substrate lift mechanism 36 while being immersed in the etching processing liquid of the processing bath 34 so that the substrates 8 are etched. Then, the etching device 1 delivers the lot from the substrate lift mechanism 36 to the substrate holder 22 of the lot conveyance mechanism 19. The lot is received from the substrate holder 22 of the lot conveyance mechanism 19 by the substrate lift mechanism 37, and is moved up and down by the substrate lift mechanism 37 while being immersed in the rinse processing liquid of the processing bath 35 so that the substrates 8 are rinsed. Thereafter, the lot is delivered to the substrate holder 22 of the lot conveyance mechanism 19 from the substrate lift mechanism 37.

The controller 7 controls operations of respective units of the substrate liquid processing system 1A (the carrier carry-in/out section 2, the lot forming section 3, the lot placing section 4, the lot conveyance section 5, the lot processing section 6, and the etching device 1).

The controller 7 is constituted by, for example, a computer, and includes a computer readable storage medium 38. A program that controls various processings to be executed in the substrate liquid processing apparatus 1 is stored in the storage medium 38. The controller 7 reads and executes the program stored in the storage medium 38 to control the operation of the substrate liquid processing apparatus 1. The program has been recorded in the computer readable storage medium 38, and may be installed from another storage medium to the storage medium 38 of the controller 7. As the computer readable storage medium 38, for example, a hard disk (HD), a flexible disk (FD), a compact disk (CD), a magneto optical disk (MO), and a memory card may be exemplified.

As described above, in the processing bath 34 of the etching device 1, an aqueous solution of a chemical agent (phosphoric acid) at a predetermined concentration (i.e., a phosphoric acid aqueous solution) is used as a processing liquid (an etching liquid) to perform a liquid processing (an etching processing) on the substrates 8.

Figure 2:
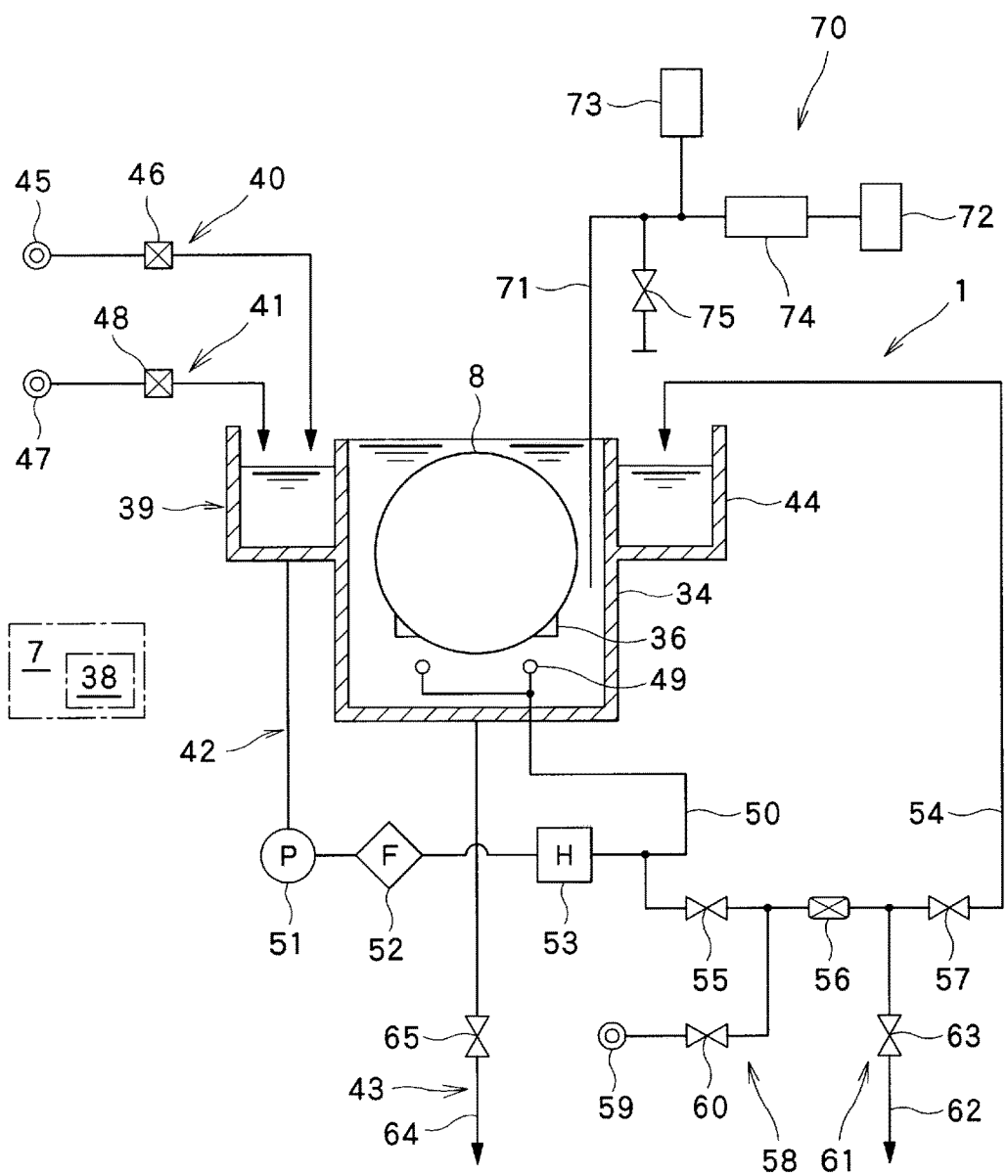
FIG. 2 is a side view illustrating the substrate liquid processing apparatus.
Figure 3:
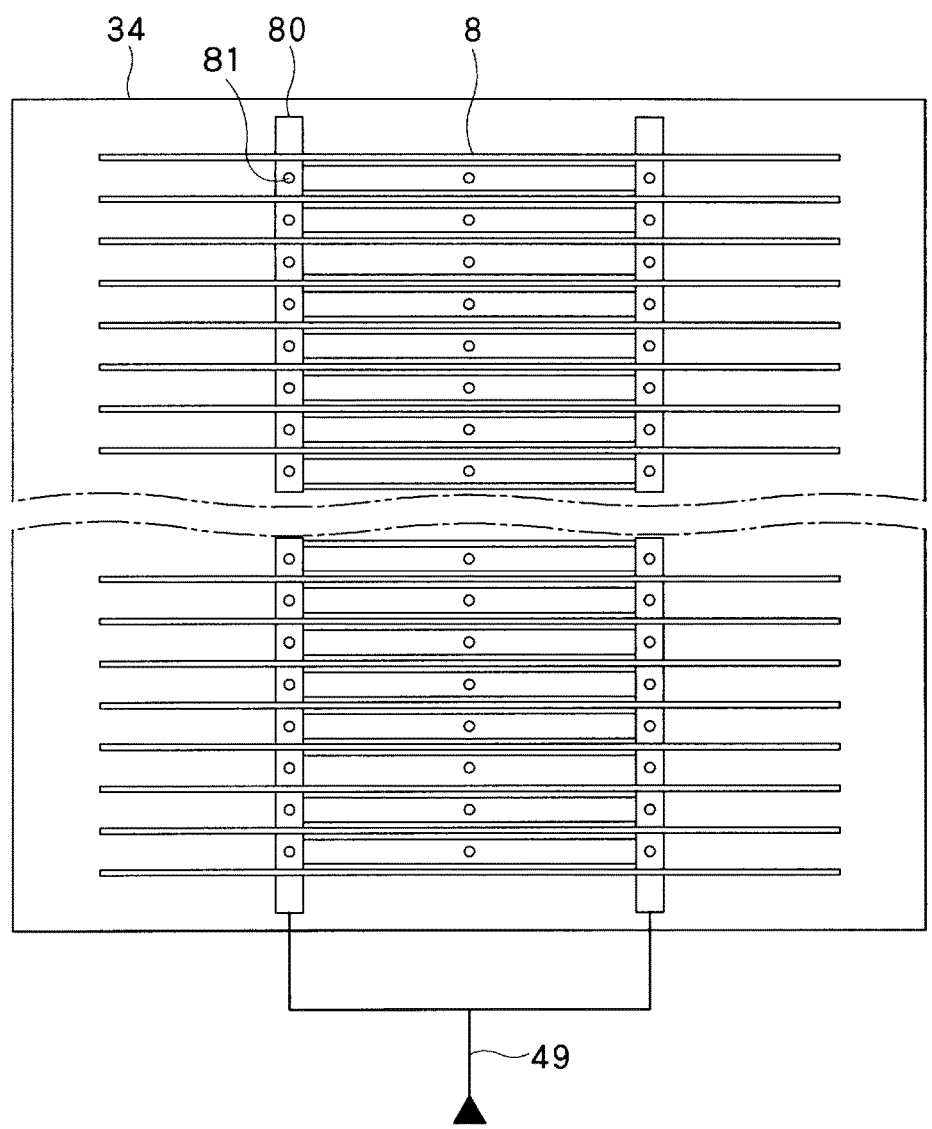
FIG. 3 is a plan view illustrating the substrate liquid processing apparatus.
Figure 4A:
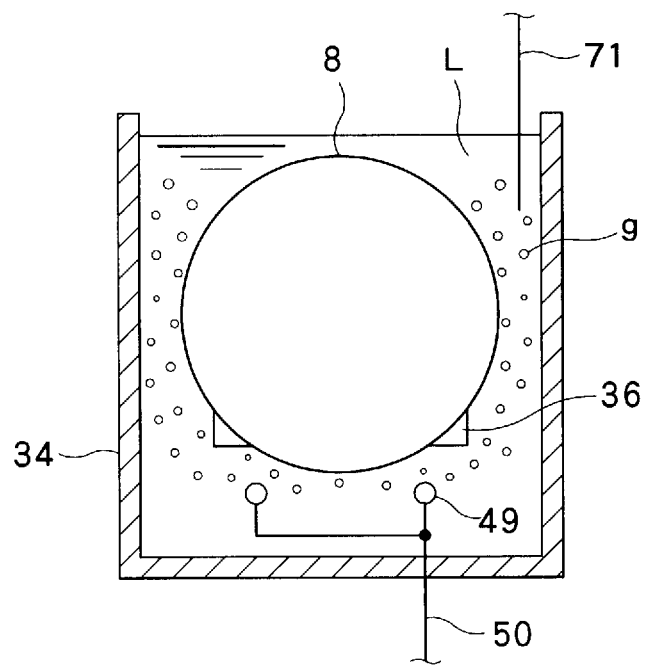
FIGS. 4A and 4B are views illustrating a boiling state of a phosphoric acid aqueous solution.
Figure 4B:
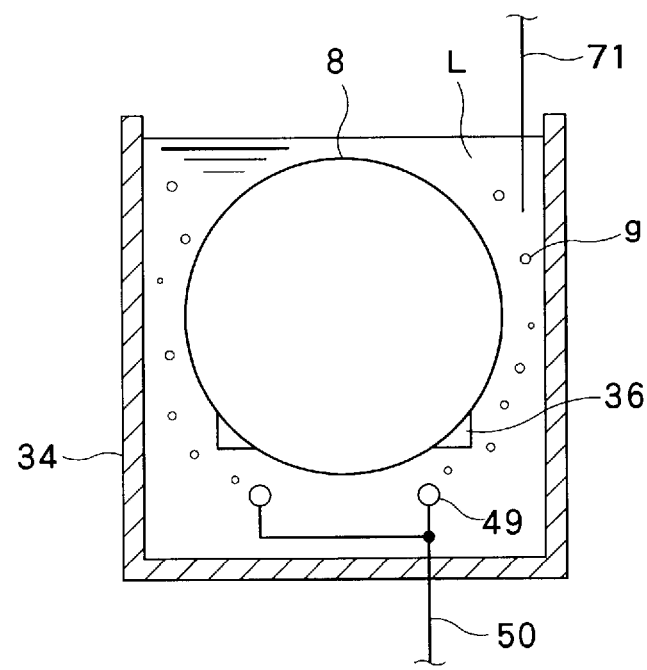

The etching device (the substrate liquid processing apparatus) 1, as illustrated in FIGS. 2 and 3, includes: a liquid processing unit 39 configured to store a processing liquid and process the substrates 8, the processing liquid consisting of a phosphoric acid aqueous solution at a predetermined concentration; a phosphoric acid aqueous solution supply unit 40 configured to supply the phosphoric acid aqueous solution to the liquid processing unit 39; a pure water supply unit 41 configured to supply pure water with which the phosphoric acid aqueous solution is diluted; a processing liquid circulating line 42 configured to circulate the processing liquid stored in the liquid processing unit 39; and a processing liquid discharge unit 43 configured to discharge the processing liquid from the liquid processing unit 39.

Among these, the liquid processing unit 39 includes the processing bath 34 for etching, whose top side is opened, and an outer bath 44 provided around the upper portion of the processing bath 34 and having a top opening. The processing liquid is stored in the processing bath 34 and the outer bath 44. The processing bath 34 stores the processing liquid in which the substrates 8 are immersed by the substrate lift mechanism 36 and subjected to a liquid processing. The outer bath 44 stores the processing liquid overflowing from the processing bath 34, and supplies the processing liquid to the processing bath 34 by the processing liquid circulating line 42. In the substrate lift mechanism 36, the plurality of substrates 8 are held while being aligned at intervals in a vertically erected posture in a horizontal direction.

The phosphoric acid aqueous solution supply unit 40 supplies an aqueous solution of a chemical agent (phosphoric acid) (a phosphoric acid aqueous solution) having a concentration lower than the processing liquid, to the liquid processing unit 39. The phosphoric acid aqueous solution supply unit 40 includes an aqueous solution supply source 45 that supplies a phosphoric acid aqueous solution at a predetermined concentration and a predetermined temperature. The aqueous solution supply source 45 is connected to the outer bath 44 of the liquid processing unit 39 via a flow rate regulator 46. The flow rate regulator 46 is connected to the controller 7, and the opening/closing and the flow rate of the flow rate regulator 46 are controlled by the controller 7.

The pure water supply unit 41 supplies pure water in order to replenish moisture evaporated by heating (boiling) the processing liquid. The pure water supply unit 41 includes a pure water supply source 47 that supplies pure water at a predetermined temperature. The pure water supply source 47 is connected to the outer bath 44 of the liquid processing unit 39 via a flow rate regulator 48. The flow rate regulator 48 is connected to the controller 7, and the opening/closing and the flow rate of the flow rate regulator 48 are controlled by the controller 7.

The processing liquid circulating line 42 includes a processing liquid supply nozzle 49 disposed below the substrates 8 held by the substrate lift mechanism 36 within the processing bath 34, and a circulation flow path 50 formed between the bottom portion of the outer bath 44 of the liquid processing unit 39 and the processing liquid supply nozzle 49. In the circulation flow path 50, a supply pump 51, a filter 52, and a heater 53 are sequentially provided. The supply pump 51 and the heater 53 are connected to the controller 7, and driven and controlled by the controller 7. The processing liquid circulating line 42 circulates the processing liquid from the outer bath 44 to the processing bath 34 by driving the supply pump 51. Here, the processing liquid is heated to a predetermined temperature by the heater 53. The processing liquid circulating line 42 including the supply pump 51, the filter 52, and the heater 53 serves as a processing liquid supply unit that supplies the processing liquid to the liquid processing unit 39.

As illustrated in FIG. 3, the processing liquid supply nozzle 49 has a tubular shape extending in the arrangement direction of the plurality of substrates 8. Then, the processing liquid is ejected toward the substrates 8 held by the substrate lift mechanism 36 from a plurality of ejecting holes 81 formed in the peripheral surface of the processing liquid supply nozzle 49.

The processing liquid circulating line 42 is connected to a concentration measuring flow path 54 formed between the downstream side of the heater 53 of the circulation flow path 50 and the outer bath 44. In the concentration measuring flow path 54, an upstream side opening/closing valve 55, a concentration sensor 56 (a concentration measurement unit), and a downstream side opening/closing valve 57 are sequentially provided. A cleaning fluid supply unit 58 is connected between the upstream side opening/closing valve 55 and the concentration sensor 56 to supply a cleaning fluid (here, pure water at room temperature) for cleaning the concentration sensor 56. The cleaning fluid supply unit 58 includes a cleaning fluid supply source 59 that supplies a cleaning fluid, and the cleaning fluid supply source 59 is connected between the upstream side opening/closing valve 55 and the concentration sensor 56 via a supply opening/closing valve 60. A cleaning fluid discharge unit 61 is connected between the concentration sensor 56 and the downstream side opening/closing valve 57 to discharge the cleaning fluid. The cleaning fluid discharge unit 61 includes a discharge flow path 62 connected between the concentration sensor 56 and the downstream side opening/closing valve 57 and communicating with an external drain pipe, and a discharge opening/closing valve 63 is provided in the discharge flow path 62. The upstream side opening/closing valve 55, the downstream side opening/closing valve 57, the supply opening/closing valve 60, and the discharge opening/closing valve 63 are connected to the controller 7, and are controlled to be opened and closed by the controller 7. The concentration sensor 56 is connected to the controller 7, measures the concentration of the processing liquid flowing through the concentration measuring flow path 54 according to the instruction from the controller 7, and notifies the controller 7 of the concentration. The cleaning fluid discharge unit 61 mainly discharges the cleaning fluid, but also discharges the processing liquid staying in the concentration measuring flow path 54.

The processing liquid discharge unit 43 includes a drainage flow path 64 connected to the bottom portion of the processing bath 34 of the liquid processing unit 39 and communicating with an external drain pipe, and an opening/closing valve 65 is provided in the drainage flow path 64. The opening/closing valve 65 is connected to the controller 7, and controlled to be opened and closed by the controller 7.

A boiling state detecting unit 70 is provided in the processing bath 34 of the liquid processing unit 39 to detect the boiling state of the phosphoric acid aqueous solution.

A commercially available product called, for example, a bubble type liquid level gauge or a gas purge type liquid level detector may be applied to the boiling state detecting unit 70, but an inert gas may be used depending on the target chemical liquid or consideration for, for example, a material of a gas ejecting pipe may be needed. As illustrated in FIG. 2, the boiling state detecting unit 70 may include a gas supply unit 72 that feeds an inert gas at a predetermined flow rate, a gas ejecting pipe 71 that purges the inert gas to a predetermined depth position in the processing liquid, a back pressure indicator 73 connected to the gas ejecting pipe 71, and an opening/closing valve 75 provided in the gas ejecting pipe 71 to discharge the inert gas in the pipe.

In the boiling state detecting unit 70, the back pressure when the inert gas is purged from the gas ejecting pipe 71 into the processing liquid is measured by the back pressure indicator 73. In this case, as the boiling degree of the processing liquid progresses, the back pressure also decreases proportionally. In relation to the change of the back pressure, for example, a difference of 10 mmAq or more is observed between when the processing liquid is not boiling, and when the processing liquid is boiling intensely. Thus, the boiling degree of the processing liquid may be evaluated based on the detection value detected by the back pressure indicator 73.

The detection value detected by the back pressure indicator 73 is sent to the controller 7.

The substrate liquid processing apparatus 1 is configured as described above, and the controller 7 controls operations of the respective units (the carrier carry-in/out section 2, the lot forming section 3, the lot placing section 4, the lot conveyance section 5, the lot processing section 6, and the etching device 1) according to, for example, a substrate liquid processing program stored in the storage medium 38 so that the substrates 8 are processed.

Hereinafter, the operation of the present exemplary embodiment configured as described, that is, the substrate liquid processing method, will be described. First, the phosphoric acid aqueous solution (the processing liquid) at a predetermined concentration and at a predetermined temperature is supplied to the outer bath 44 of the liquid processing unit 39 by the phosphoric acid aqueous solution supply unit 40 of the etching device 1. Next, the processing liquid from the outer bath 44 is heated by the heater 53 of the processing liquid circulating line 42 to a predetermined concentration (e.g., 87.4 wt %) and a predetermined temperature (e.g., 160° C.), and is stored in the processing bath 34 of the liquid processing unit 39. Here, the moisture is evaporated by the heating of the heater 53 to become air bubbles and the air bubbles rise in the processing liquid while the processing liquid is placed in a boiling state. In this case, since the concentration of the processing liquid is increased, pure water in an amount corresponding to the amount of moisture evaporated by the heating is supplied to the outer bath 44 of the liquid processing unit 39 by the pure water supply unit 41 so that the processing liquid is diluted with the pure water. Then, the substrates 8 are immersed by the substrate lift mechanism 36 in the processing bath 34 that stores the processing liquid at a predetermined concentration and a predetermined temperature so that the substrates 8 are subjected to an etching processing (liquid processing) by the processing liquid. Here, the air bubbles formed by evaporation of the moisture rise in the processing liquid, and the processing liquid is circulated by the rising air bubbles, thereby promoting the etching processing by the processing liquid.

During the liquid processing, the phosphoric acid aqueous solution supply unit 40, the pure water supply unit 41, and the supply pump 51 and the heater 53 of the processing liquid circulating line 42 are controlled by the controller 7 to maintain the processing liquid at a predetermined concentration and a predetermined temperature.

In this case, the controller 7 drives the supply pump 51 to circulate the processing liquid through the circulation flow path 50, and drives the heater 53 to maintain the temperature of the processing liquid at a predetermined temperature so that the liquid processing of the substrates 8 is initiated.

At a predetermined timing after the liquid processing initiation, the controller 7 measures the concentration of the processing liquid by the concentration sensor 56. As in the liquid processing, the controller 7 drives the supply pump 51 to circulate the processing liquid through the circulation flow path 50, and drives the heater 53 to maintain the temperature of the processing liquid at a predetermined temperature. While the upstream side opening/closing valve 55 and the downstream side opening/closing valve 57 are opened, a part of the processing liquid flowing through the circulation flow path 50 is caused to flow through the concentration measuring flow path 54 so that the concentration sensor 56 measures the concentration of the processing liquid. After the concentration measurement, the upstream side opening/closing valve 55 and the downstream side opening/closing valve 57 are returned to a closed state, and all the processing liquid is circulated through the circulation flow path 50.

Meanwhile, the back pressure of the inert gas is measured by the back pressure indicator 73 of the boiling state detecting unit 70, and the boiling state of the processing liquid within the processing bath 34 is detected by the back pressure of the inert gas measured by the back pressure indicator 73.

When the processing liquid consisting of the phosphoric acid aqueous solution is used to etch the substrates 8 composed of silicon wafers accommodated in the processing bath 34, the boiling state of the processing liquid largely affects the etching uniformity. Thus, in the present exemplary embodiment, the boiling state of the processing liquid is adjusted by controlling the supply pump 51 by the controller 7.

Specifically, based on the back pressure of the inert gas measured by the back pressure indicator 73 of the boiling state detecting unit 70, the controller 7 compares the reference back pressure that is a preset reference, to the measurement back pressure measured by the back pressure indicator 73, and determines the boiling state of the processing liquid.

When the controller 7 determines that the boiling state of the processing liquid (L) is intense (FIG. 4A) by comparing the reference back pressure to the measurement back pressure, the controller 7 controls the supply pump 51 to increase the flow rate and pressure of the processing liquid. When the heating temperature of the processing liquid is constant, the increase of the pressure of the processing liquid (L) suppresses the evaporation of moisture, so that the amount of air bubbles (g) generated by the moisture evaporation is reduced and the boiling state of the processing liquid becomes gentle.

Meanwhile, when the controller 7 determines that the boiling state of the processing liquid (L) is gentle (FIG. 4B) based on the signal from the boiling state detecting unit 70, the controller 7 controls the supply pump 51 to decrease the flow rate and pressure of the processing liquid (L). The decrease of the pressure of the processing liquid (L) activates the evaporation of moisture, so that the amount of air bubbles (g) is increased and the boiling state of the processing liquid becomes intense.

As described above, according to the present exemplary embodiment, the controller 7 controls the supply pump 51 to adjust the pressure of the processing liquid (L) within the circulation flow path 50 so that the amount of air bubbles (g) generated by the moisture evaporation is changed and the boiling state of the processing liquid (L) may be adjusted to a desired state. As described above, since the boiling state of the processing liquid (L) may be adjusted to a desired state, etching uniformity on the substrates 8 may be achieved.

Although it is conceivable to change the concentration of the processing liquid in order to change the boiling state of the processing liquid (L), the concentration change of the processing liquid also changes the etching uniformity of the substrates 8.

In contrast, according to the present exemplary embodiment, it is possible to easily and simply change the boiling state of the processing liquid (L) without changing the concentration of the processing liquid or performing a complicated adjustment, and to achieve the etching uniformity on the substrates 8.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of performing a liquid processing on substrates, the method comprising:
    processing the substrates using a phosphoric acid aqueous solution having a predetermined concentration of phosphoric acid in a liquid processing unit including a bath that stores the processing liquid and the substrates;
    supplying the phosphoric acid aqueous solution to the liquid processing unit by a processing liquid supply including a supply pump;
    detecting an intensity of a boiling state of the phosphoric acid aqueous solution by a boiling state detector including a back pressure indicator provided in the liquid processing unit, the back pressure indicator configured to detect a back pressure of an inert gas within the bath; and
    controlling the supply pump based on a signal from the boiling state detector by a controller and adjusting a pressure of the phosphoric acid aqueous solution in a flow path supplied from the processing liquid supply to the liquid processing unit, such that the intensity of the boiling state of the phosphoric acid may be adjusted to a desired intensity level while the predetermined concentration of the phosphoric acid in the phosphoric acid aqueous solution is unchanged.

2. The method of claim 1, wherein when the boiling state of the phosphoric acid aqueous solution is intense based on the signal from the boiling state detector, the controller increases the pressure of the phosphoric acid aqueous solution in the flow path from the supply pump to suppress the boiling state of the phosphoric acid aqueous solution, and
    when the boiling state of the phosphoric acid aqueous solution is gentle, the controller decreases the pressure of the phosphoric acid aqueous solution in the flow path from the supply pump to promote the boiling state of the phosphoric acid aqueous solution.

3. The method of claim 1, wherein the processing liquid supply includes a processing liquid circulating line connected to the liquid processing unit, and
    the supply pump is provided in the processing liquid circulating line.

4. The method of claim 1, wherein the processing liquid supply is connected to a phosphoric acid aqueous solution supply configured to supply the phosphoric acid aqueous solution, and a pure water supply configured to supply pure water.

5. A method of performing a liquid processing on substrates, the method comprising:
    processing the substrates using a phosphoric acid aqueous solution having a predetermined concentration of phosphoric acid in a liquid processing unit including a bath that stores the phosphoric acid aqueous solution and the substrates;
    supplying the phosphoric acid aqueous solution to the liquid processing unit by a processing liquid supply including a supply pump;
    detecting an intensity of a boiling state of the phosphoric acid aqueous solution by a boiling state detector including a back pressure indicator provided in the liquid processing unit, the back pressure indicator configured to detect a back pressure of an inert gas within the bath; and
    controlling the supply pump based on a signal from the boiling state detector by a controller and adjusting a pressure of the phosphoric acid aqueous solution in a flow path supplied from the processing liquid supply to the liquid processing unit, such that the intensity of the boiling state of the phosphoric acid may be adjusted to a desired intensity level, and
    wherein the processing liquid supply includes a processing liquid circulating line connected to the liquid processing unit, and the supply pump is provided in the processing liquid circulating line.

6. The method of claim 5, further comprising circulating the phosphoric acid aqueous solution between the liquid processing unit and the processing liquid supply via the processing liquid circulating line.

7. The method of claim 4, further comprising storing both the phosphoric acid aqueous solution and the pure water together in an outer bath separate from the substrates.

* * * * *